United States Patent
Duckham et al.

(10) Patent No.: US 7,810,704 B2
(45) Date of Patent: *Oct. 12, 2010

(54) METHOD FOR FABRICATING LARGE DIMENSION BONDS USING REACTIVE MULTILAYER JOINING

(75) Inventors: Alan Duckham, Baltimore, MD (US); Jesse E. Newson, Cockeysville, MD (US); Michael V. Brown, Endicott, NY (US); Timothy Ryan Rude, Salt Lake City, UT (US); Omar M. Knio, Timonium, MD (US); Ellen M. Heian, Cockeysville, MD (US); Jai S. Subramanian, Solon, OH (US)

(73) Assignee: Nanofoil Corporation, Utica, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/103,484

(22) Filed: Apr. 15, 2008

(65) Prior Publication Data

US 2008/0299410 A1    Dec. 4, 2008

Related U.S. Application Data

(60) Continuation of application No. 12/029,256, filed on Feb. 11, 2008, which is a division of application No. 11/393,055, filed on Mar. 30, 2006, now Pat. No. 7,354,659.

(60) Provisional application No. 60/666,179, filed on Mar. 30, 2005.

(51) Int. Cl.
  *B23K 20/08* (2006.01)
(52) U.S. Cl. .................... 228/234.3; 228/107
(58) Field of Classification Search .......... 228/101, 228/102, 107, 108, 109, 115, 117, 175, 178, 228/190, 234.3, 246, 262.9, 2.5; 428/635
See application file for complete search history.

(56) References Cited

U.S. PATENT DOCUMENTS 3,364,561 A    1/1968  Barrington (Continued)

FOREIGN PATENT DOCUMENTS

EP    0445997 A1    9/1991

OTHER PUBLICATIONS

PCT—International Preliminary Report on Patentability, for International Application No. PCT/US2006/015387, mailed on Nov. 6, 2008.

*Primary Examiner*—Emily M Le
*Assistant Examiner*—Megha Mehta
(74) *Attorney, Agent, or Firm*—Polster, Lieder, Woodruff & Lucchesi, L.C.

(57) ABSTRACT

A method for joining component bodies of material over bonding regions of large dimensions by disposing a plurality of substantially contiguous sheets of reactive composite materials between the bodies and adjacent sheets of fusible material. The contiguous sheets of the reactive composite material are operatively connected by an ignitable bridging material so that an igniting reaction in one sheet will cause an igniting reaction in the other. An application of uniform pressure and an ignition of one or more of the contiguous sheets of reactive composite material causes an exothermic thermal reaction to propagate through the bonding region, fusing any adjacent sheets of fusible material and forming a bond between the component bodies.

17 Claims, 10 Drawing Sheets

U.S. PATENT DOCUMENTS

| | | |
|---|---|---|
| 3,503,110 A * | 3/1970 | Hardwick et al. ...... 29/890.044 |
| 3,624,237 A | 11/1971 | Persson |
| 3,663,723 A | 5/1972 | Persson |
| 3,748,721 A | 7/1973 | Alexander |
| 5,230,462 A | 7/1993 | Vascak et al. |
| 5,338,795 A | 8/1994 | Fukumoto et al. |
| 5,346,119 A | 9/1994 | Koschlig et al. |
| 5,381,944 A | 1/1995 | Makowiecki et al. |
| 5,471,092 A | 11/1995 | Chan et al. |
| 5,538,795 A | 7/1996 | Barbee, Jr. et al. |
| 5,547,715 A | 8/1996 | Barbee, Jr. et al. |
| 5,693,203 A | 12/1997 | Ohhashi et al. |
| 5,857,611 A | 1/1999 | Gilman et al. |
| 6,071,389 A | 6/2000 | Zhang |
| 6,534,194 B2 | 3/2003 | Weihs et al. |
| 6,708,870 B2 | 3/2004 | Koenigsmann et al. |
| 6,736,942 B2 | 5/2004 | Weihs et al. |
| 6,863,992 B2 | 3/2005 | Weihs et al. |
| 6,988,306 B2 | 1/2006 | Koenigsmann et al. |
| 7,441,688 B2 | 10/2008 | Van Heerden et al. |
| 2002/0182436 A1 * | 12/2002 | Weihs et al. ................. 428/635 |
| 2003/0192445 A1 | 10/2003 | Baginski et al. |
| 2004/0222090 A1 | 11/2004 | Scott et al. |
| 2005/0051607 A1 * | 3/2005 | Wang et al. .................. 228/246 |
| 2005/0082343 A1 | 4/2005 | Wang et al. |
| 2005/0121499 A1 | 6/2005 | Heerden et al. |
| 2005/0136270 A1 | 6/2005 | Besnoin et al. |
| 2005/0142495 A1 | 6/2005 | Van Heerden et al. |
| 2006/0035034 A1 | 2/2006 | Matsumoto et al. |

* cited by examiner

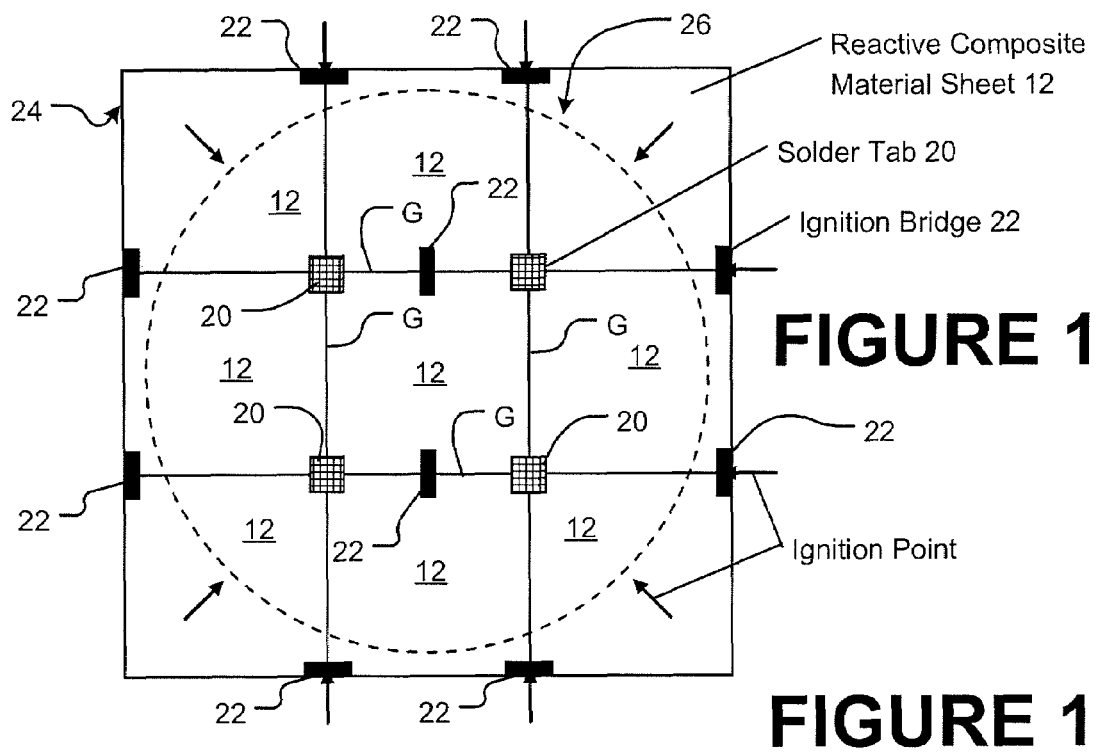
FIGURE 12
FIGURE 13
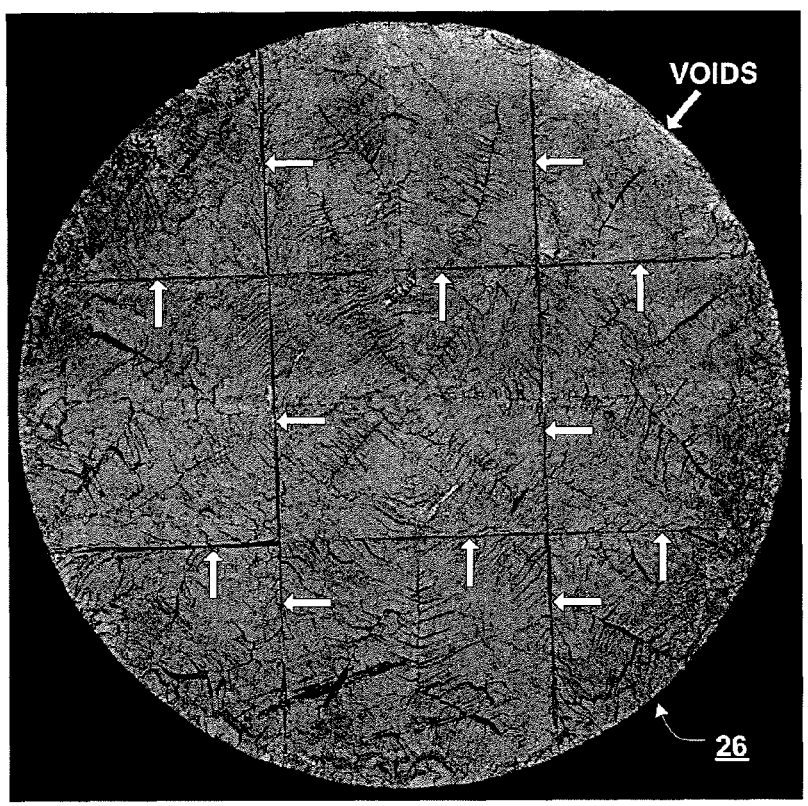

US 7,810,704 B2

METHOD FOR FABRICATING LARGE DIMENSION BONDS USING REACTIVE MULTILAYER JOINING

CROSS-REFERENCE TO RELATED APPLICATIONS

The present application is a continuation of, and claims priority from U.S. patent application Ser. No. 12/029,256 filed on Feb. 11, 2008, which in turn is a divisional and claims priority from U.S. Ser. No. 11/393,055 filed Mar. 30, 2006 (now U.S. Pat. No. 7,354,659 issued Apr. 8, 2008), which in turn is related to, and claims priority from, U.S. Provisional Patent Application Ser. No. 60/666,179 filed on Mar. 30, 2005, all of which are herein incorporated by reference.

STATEMENT REGARDING FEDERALLY SPONSORED RESEARCH

The United States government has certain rights in this invention pursuant to NSF Award DMI-034972.

BACKGROUND OF THE INVENTION

This invention relates to the joining of bodies of material over bonding regions of large dimension using reactive composite materials such as reactive multilayer foils.

Reactive composite joining, such as shown in U.S. Pat. No. 6,534,194 B2 to Weihs et al and in U.S. Pat. No. 6,736,942 to Weihs et al. is a particularly advantageous process for soldering, welding, or brazing materials at room temperature. The process involves sandwiching a reactive composite material (RCM) between two layers of a fusible material. The RCM and the fusible material are then disposed between the two components to be joined, and the RCM is ignited. A self-propagating reaction is initiated within the RCM which results in a rapid rise in temperature within the RCM. The heat released by the reaction melts the adjacent fusible material layers, and upon cooling, the fusible material bonds the two components together.

Alternatively, depending upon the composition of the two components, the layers of fusible material are not used, and the reactive composite material is placed directly between the two components. Thermal energy released by ignition of the RCM melts material from the adjacent component surfaces and consequently joins the components.

Turning to FIG. 1, an arrangement 9 for performing the process of reactive composite joining of two components 10A and 10B is illustrated. A sheet or layer of reactive composite material 12 is disposed between two sheets or layers of fusible material 14A and 14B which, in turn, are sandwiched between the mating surfaces (not visible) of the components 10A and 10B. The sandwiched assembly is then pressed together, as symbolized by vise 16, and the reactive composite is ignited, as by match 18. The reaction propagates rapidly through the RCM 12, melting fusible layers 14A and 14B. The melted layers cool, joining the components 10A and 10B together. The RCM 12 is typically reactive multilayer foil, and the fusible materials 14A and 14B are typically solders or brazes.

The process of joining the two components 10A and 10B occurs more rapidly with a reactive composite joining process than with conventional joining techniques such as those which utilize furnaces or torches. Thus, significant gains in productivity can be achieved. In addition, with the very localized heating associated with the reactive composite joining process, temperature sensitive components, as well as dissimilar materials such as metals and ceramics, can be soldered or brazed without thermal damage. Fine-grained metals can be soldered or brazed together using a reactive composite joining process without grain growth, and bulk amorphous materials can be welded together with only a local excursion from room temperature, producing a high strength bond while minimizing crystallization.

The reactive composite materials 12 used in reactive composite joining process are typically nanostructured materials such as described in U.S. Pat. No. 6,534,194 B2 Weihs et al. The reactive composite materials 12 are typically fabricated by vapor depositing hundreds of nano-scale layers which alternate between elements having large, negative heats of mixing, such as nickel and aluminum. Recent developments have shown that it is possible to carefully control both the heat of the reaction as well as the reaction velocity by varying the thicknesses of the alternating layers. It has also been shown that the heats of reaction can be controlled by modifying the foil composition, or by low-temperature annealing of the reactive multi-layers after their fabrication. It is further known that alternative methods for fabricating nanostructured reactive multilayers include mechanical processing.

Two key advantages achieved by the use of reactive composite materials for joining components are speed and the localization of heat to the joint area. The increased speed and localization are advantageous over conventional soldering or brazing methods, particularly for applications involving temperature-sensitive components or components with a large difference in coefficient of thermal expansion, such as occur in metal/ceramic bonding. In conventional welding or brazing, temperature-sensitive components can be destroyed or damaged during the process. Residual thermal stress in the components may necessitate costly and time-consuming operations, such as subsequent anneals or heat treatments. In contrast, joining with reactive composites subjects the components to little heat and produces only a very local rise in temperature. Generally, only the adjacent fusible layers and the adjoining surfaces of the components are heated substantially. Thus, the risk of thermal damage to the components is minimized. In addition, reactive composite joining is fast and results in cost-effective, strong, and thermally conductive joints.

While conventional reactive composite joining works well in joining components over lengths less than about four inches and areas less than about 16 square inches, joining over larger lengths and areas presents particular challenges. It has been observed that for optimal joining it is advantageous that the surfaces to be joined be heated as uniformly, and as simultaneously, as possible. When the lengths and areas become larger, it is increasingly difficult to maintain the desired reaction simultaneity and uniformity from a single ignition point. In addition, larger joining region dimensions can exceed those of easily fabricated RCM's, requiring multiple pieces of reactive foil to cover the joint surface area. Even though the joining reaction spreads rapidly through the RCM, not every part of a large surface area joint area may be molten at the same time, possibly resulting in poor bonding between the components. Moreover, increasing the surface area to be joined presents increasingly stringent requirements for the uniform application of pressure to the components during the joining process.

Accordingly, it would be advantageous to provide a reactive composite joining process for use in joining components over surface areas which are larger than the size of a single sheet of reactive composite material, and which result in a strong and relatively uniform bond between the component materials.

BRIEF SUMMARY OF THE INVENTION

Briefly stated, the present invention provides a method for joining bodies of component material over regions of large dimensions by disposing a plurality of substantially contiguous RCM sheets between the component material bodies. Each of the substantially contiguous RCM sheets is coupled to at least one adjacent RCM sheet by a bridging material capable of transferring an energetic reaction from one sheet to another. An ignition reaction is initiated in one or more of the RCM sheets and enabled to spread through all remaining sheets via the bridging material, resulting in rapid localized heating of materials adjacent the sheets, which form a bond between the bodies of component material upon cooling.

In an embodiment of the present invention, a plurality of substantially contiguous RCM sheets disposed between component material bodies to be joined over a region of large dimension are coupled together by a bridging material. The bridging material may be in the form of a reactive foil, wire, layer, powder, or other material which is capable of conveying an ignition reaction from one sheet to another, either directly or by thermal conduction. The bridging material is reactive in response to an ignition of a first RCM sheet to ignite a second RCM sheet.

In an alternate embodiment of the present invention, a plurality of substantially contiguous RCM sheets disposed between component material bodies to be joined over a region of large dimension are coupled together by structural support tabs of fusible material to enable easy assembly, transport, and positioning of the multiple RCM sheets between the component bodies to be joined.

In a variation of the present invention, a plurality of substantially contiguous RCM sheets are disposed between component material bodies to be joined over a region of large dimensions, directly adjacent surfaces of the component material bodies to be joined.

In an alternate embodiment of the present invention, a plurality of substantially contiguous RCM sheets are disposed between component material bodies to be joined over a region of large dimensions. Sheets of fusible material such as solder or braze are disposed in proximity to the RCM sheets and to the component material bodies. The fusible material sheets can overlie, underlie, or sandwich the sheets of reactive composite materials. The fusible material sheets can be continuous across the boundaries of the contiguous RCM sheets, and may optionally function as connecting material to hold RCM sheets together.

A method of the present invention for joining bodies of component material over regions of large dimension disposes at least one RCM sheet between the component material bodies. An ignition reaction is initiated at a plurality of ignition points disposed about the RCM sheet, resulting in rapid localized heating of materials adjacent the sheets which form a bond between the bodies of component material upon cooling.

A variation of the method of the present invention for joining bodies of component material over regions of large dimension disposes at least one RCM sheet between the component material bodies. At least one spacer plate is positioned between an external pressure source and the component bodies. Pressure is applied to the arrangement from the external pressure source, urging the component bodies towards each other to control the formation of a bond between the component bodies following initiation of an ignition reaction in the RCM sheets. The ignition reaction within the RCM sheets results in rapid localized heating of materials adjacent the sheets, which form a bond between the bodies of component material upon cooling.

BRIEF DESCRIPTION OF THE SEVERAL VIEWS OF THE DRAWINGS

The advantages, nature and various additional features of the invention will appear more fully upon consideration of the illustrative embodiments now to be described in detail in connection with the accompanying drawings. In the drawings:

FIG. 12 illustrates an exemplary arrangement of contiguous reactive composite material sheets, fusible material support tabs, ignition bridges, and ignition points;

FIG. 13 is a top-plan acoustic image of a large dimension joint resulting from the arrangement illustrated in FIG. 12;

Corresponding reference numerals indicate corresponding parts throughout the several figures of the drawings. It is to be understood that the drawings are for illustrating the concepts of the invention and are not to scale.

DESCRIPTION OF THE PREFERRED EMBODIMENT

The following detailed description illustrates the invention by way of example and not by way of limitation. The description enables one skilled in the art to make and use the invention, and describes several embodiments, adaptations, variations, alternatives, and uses of the invention, including what is presently believed to be the best mode of carrying out the invention.

As used herein, the phrase "large dimension" is used to describe a joint or bonding region and is understood to mean a joint or bonding region having either an area or length which exceeds the area or length of a single sheet of reactive composite material utilized in the joining processes, which is sufficiently large enough that a single propagation wave front from an ignition reaction within a sheet of reactive composite material fails to achieve desired bond characteristics throughout the bonding region, or which exhibits a loading variation between the center and the edges of the joint or bonding region. For example, an area of at least 16.0 sq. inches or a length of at least 4.0 inches is considered to be a large dimension when utilizing a sheet of reactive composite material having an area of less than 16.0 sq. inches and a longest dimension of less than 4.0 inches.

As used herein, the phrase "reactive composite material" or "RCM" is understood by those of ordinary skill in the art to refer to structures, such as reactive multilayer foils, comprising two or more phases of materials spaced in a controlled fashion such that, upon appropriate excitation or exothermic reaction initiation, the materials undergo an exothermic chemical reaction which spreads throughout the composite material structure. These exothermic reactions may be initiated by electrical resistance heating, inductive heating, laser pulses, microwave energy, or ultrasonic agitation of the reactive composite material at one or more ignition points.

Figure 1:
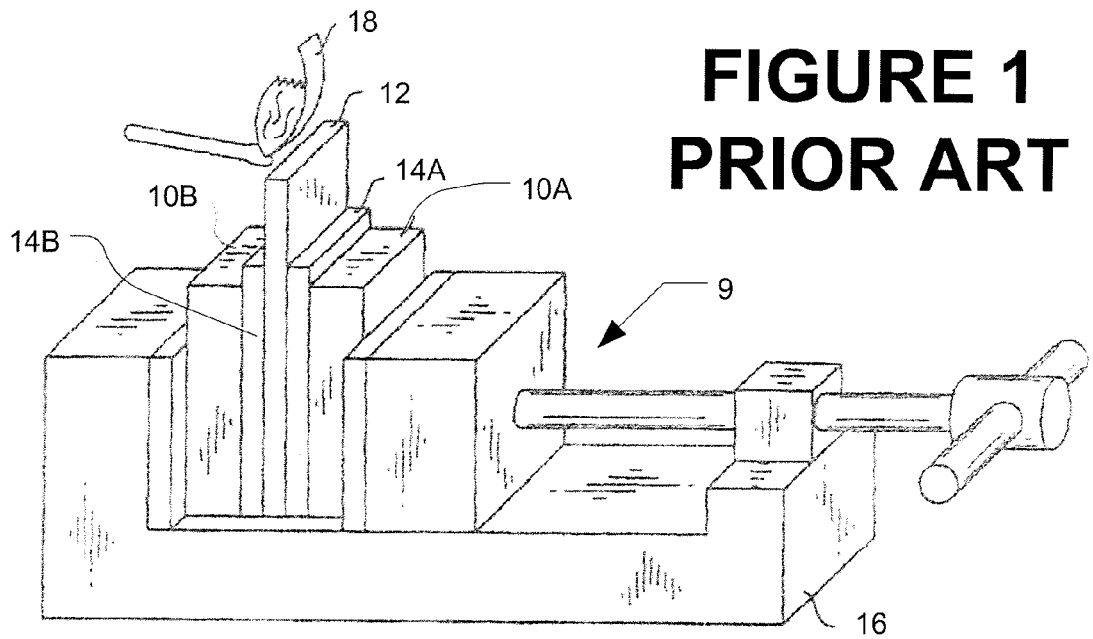
FIG. 1 schematically illustrates a prior art arrangement for performing conventional reactive composite joining of two components.
Figure 2:
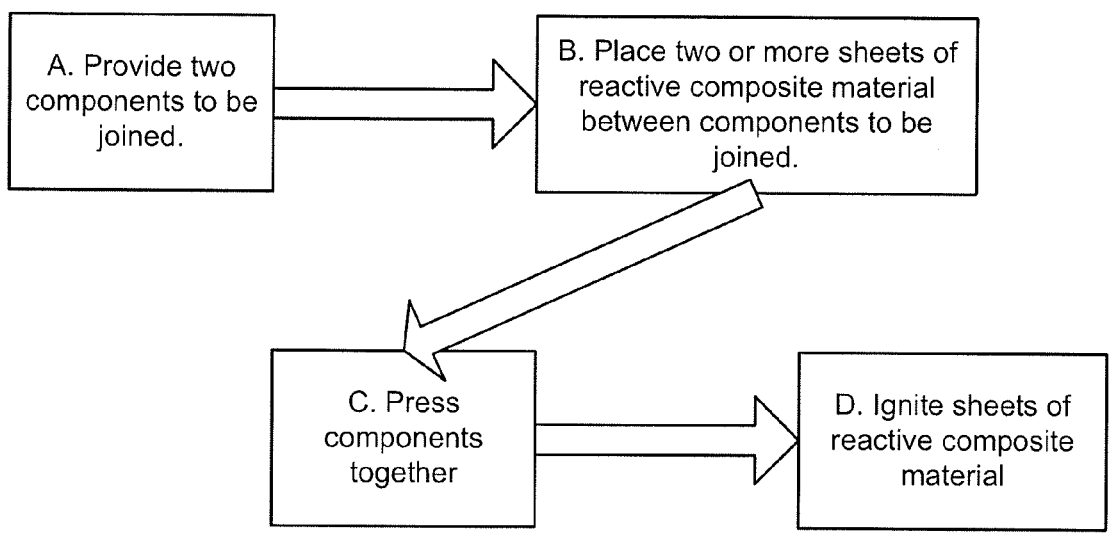
FIG. 2 is a block diagram representing the steps involved in joining two bodies by a large dimension joint in accordance with the invention.

Referring to the drawings, FIG. 2 illustrates a generalized flow diagram of the steps involved in joining together two component bodies 10A and 10B over a joint or bonding region having a large dimension (large area or large length), using at least two contiguous sheets 12 of reactive composite material. Initially, as shown in block A, two component bodies 10A and 10B to be joined over substantially conforming large dimension mating surfaces are provided. The two component bodies 10A and 10B may be coated in advance with one or more layers of a fusible material 14A and 14B, such as a solder or braze alloy, or one or more sheets of the fusible material 14A and 14B may be placed between the component bodies 10A and 10B. The component bodies 10A and 10B may comprise the same type of materials, such as brass, or may be of different types of materials, such as nickel and brass, aluminum and titanium, boron carbide and steel, boron carbide and copper, silicon carbide and aluminum, and a tungsten-titanium alloy and a copper-chromium alloy.

Next, as shown in Block B, two or more sheets 12 of reactive composite material in a substantially contiguous arrangement are disposed between the mating surfaces of the two component bodies 10A and 10B. As used herein, the term "contiguous" is understood by those of ordinary skill in the art to mean that any adjacent edges of the sheets 12 of reactive composite material are arranged as close together as necessary to form a substantially void-free bond and at least sufficiently close together such that adjacent sheets 12 of reactive composite material can be operatively connected together into a single assembly. Contiguous RCM sheets do not need to be in physical contact with each other.

Figure 3:
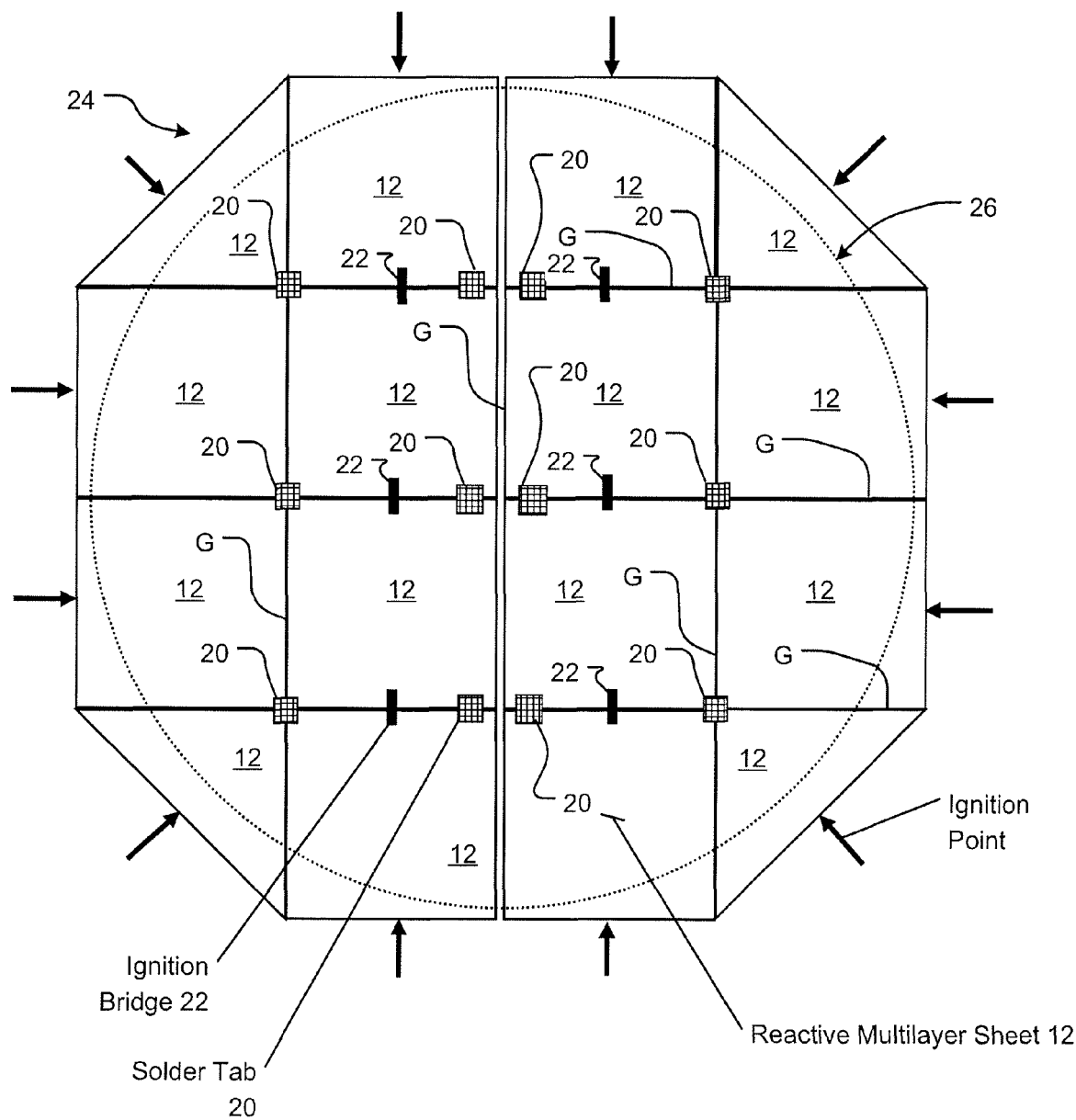
FIG. 3 is a top plan view of a plurality of contiguous reactive composite material sheets operatively connected by structural support tabs and ignition bridges within the bonding region for the formation of a large area bond between two component bodies.
Figure 4:
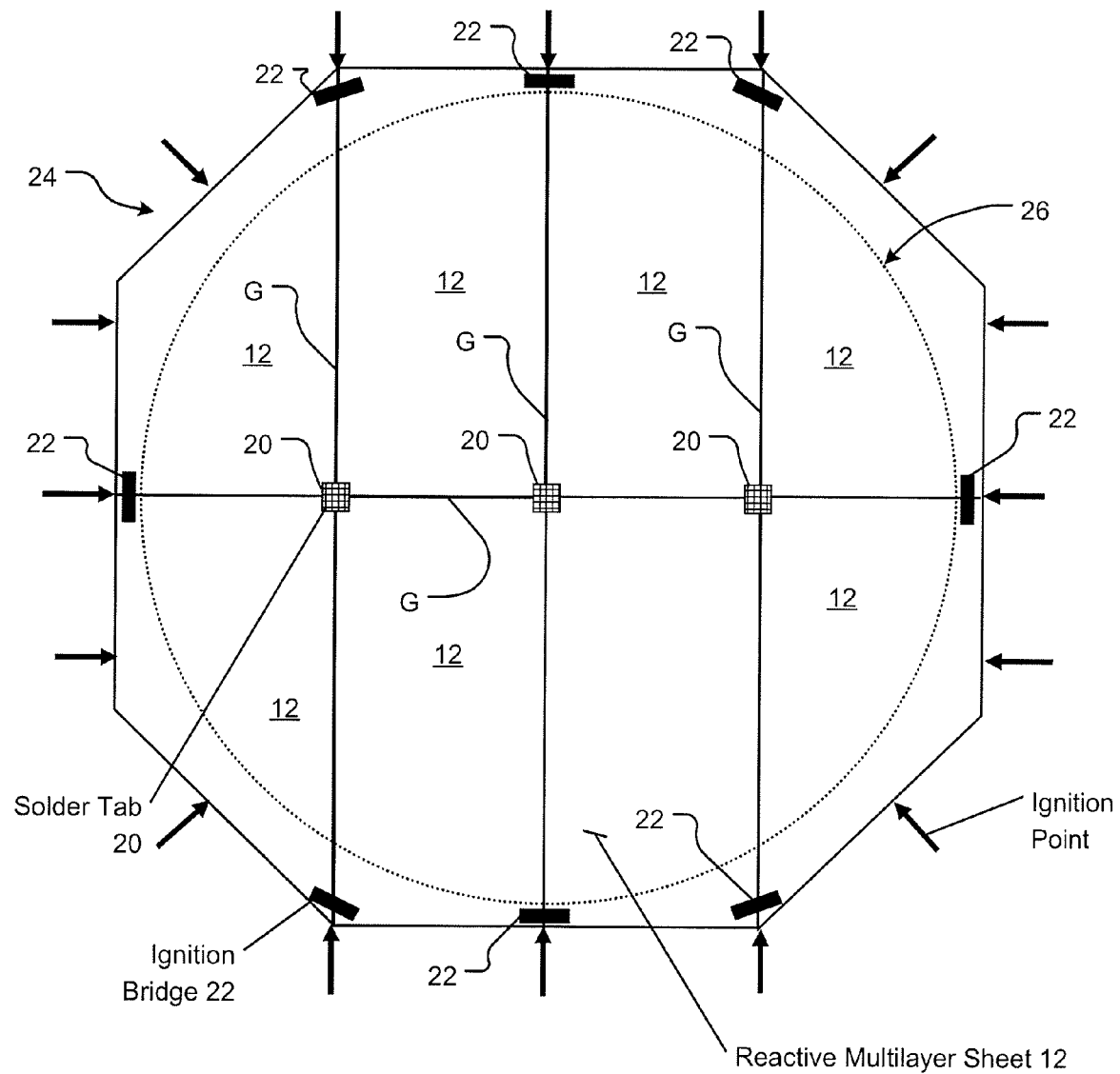
FIG. 4 is a top plan view of a plurality of contiguous reactive composite material sheets operatively connected by structural support tabs within the bonding region and ignition bridges external to the bonding region, for the formation of a large area bond between two component bodies.

To operatively connect adjacent RCM sheets 12, a number of structurally supporting bridges or tabs 20 are formed between the sheets 12 (as shown in FIGS. 3 and 4). The bridges or tabs may be formed from either a fusible material 20 which will form part of the bond between the component bodies 10A and 10B, or may be formed from reactive material 22 which is capable of conveying an ignition reaction between adjacent sheets of RCM. Using the bridges or tabs 20, 22, two or more adjacent RCM sheets 12 are secured together in an assembly 24 in such a way as to maintain the relative positions to each other during assembly, transport, and positioning between the matching surfaces of the component bodies 10A and 10B in the large dimension bonding region.

A structural support bridge or tab 20 can be in any one of several forms to secure contiguous RCM sheets 12 together in the assembly 24. In one exemplary embodiment, the structural support bridges or tabs 20 are in the form of a soft metal or fusible material sheet, for instance indium, which is cold-pressed or rolled onto the RCM sheets 12.

An ignition bridge or tab 22 formed from a reactive material is preferably selected such that it will either ignite or conduct thermal energy between the adjacent sheets 12 to enable a reaction initiated in a first sheet 12A to continue via the bridge or tab to the adjacent sheet 12B. The configuration of an ignition bridge or tab 22 can be in any one of several forms to assist propagation of reaction between contiguous RCM sheets 12. For example, the ignition bridge or tab 22 can be in the form of a reactive multilayer foil, similar or identical to that used for the RCM sheets 12, or a thin wire that contains regions or layers of materials with a large negative heat of mixing. These configurations of the ignition bridges or tabs 22 can be attached to one or both contiguous sheets 12 with a small amount of glue or with a small piece of fusible solder. In addition to conveying an initiated reaction, ignition bridges or tabs 22 may be structural in nature, i.e. providing structural support to an arrangement of sheets 12 of RCM, or may be non-structurally supporting in nature, For example, a non-structurally supporting ignitable bridge 22 can be in the form of a loose or compact powder mixture of materials with a large negative heat of mixing.

Advantageously, the various forms of both bridges and tabs 20, 22 are small in comparison to the size of the RCM sheets 12, and do not interfere with the flow of any fusible material present in the bonding region, or with the flatness of the component body mating surfaces during the joining process.

Turning to FIG. 3, an exemplary arrangement of a plurality of contiguous RCM sheets 12 are shown arranged and connected by solder assembly tabs 20 and ignitable bridges 22 to form a reactive composite material sheet assembly 24 covering a large area bonding region 26 between two component bodies (not shown). In the arrangement shown in FIG. 3, both the solder assembly tabs 20 and the ignitable bridges 22 are contained within the large area bonding region 26. The arrows arranged about the periphery of the assembly 24 indicate a plurality of ignition or reaction initiation points associated with the assembly 24.

FIG. 4 illustrates a second exemplary arrangement of a plurality of contiguous RCM sheets 12 arranged and connected by solder assembly tabs 20 and ignitable bridges 22 to form a reactive composite material sheet assembly 24 covering a large area bonding region 26 between two component bodies (not shown). In the arrangement shown in FIG. 4, the solder assembly tabs 20 are contained within the large area bonding region 26, while the ignitable bridges 22 are disposed outside the large area bonding region 26. By disposing the ignitable bridges 22 outside of the large bonding region 26, the ignitable bridges 22 may be attached to the sheets 12 of the assembly 24 with tape or other means that would not be possible within the large area bonding region. The bridges may thus be used for securing the sheets 12 within the assembly 24, as well as for ignition of the bonding reactions, as is indicated by the arrows arranged about the periphery of the assembly 24 to indicate a plurality of ignition or reaction initiation points.

Within a large area bonding region 26, the solder tabs 20 may be secured to the sheets 12 of the assembly 24 by pressing or with a minimal amount of glue. If it is undesirable to use a solder material for the tabs 20 which differs from the solder material used as a fusible material within the joint, due to concerns about alloying, small tabs of the desired solder could be glued to the reactive sheets, preferably minimizing the amount of glue.

Figure 5:
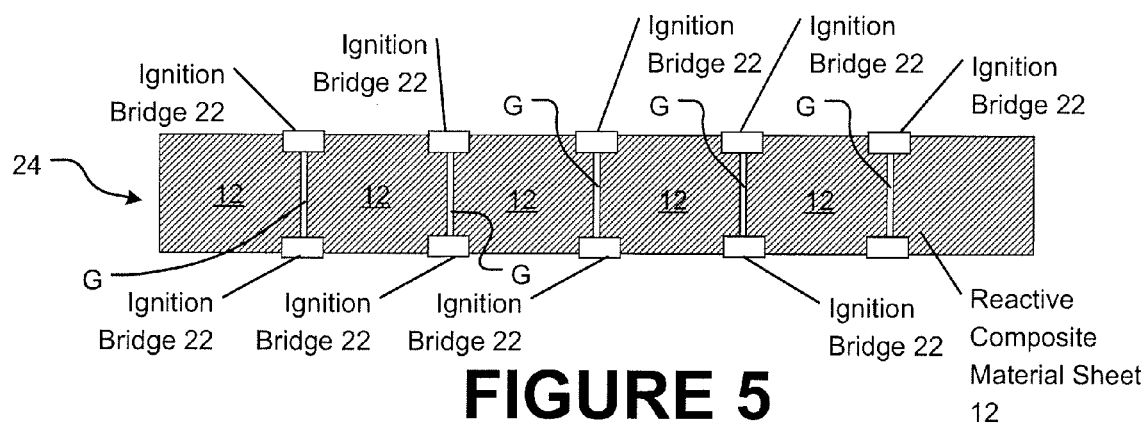
FIG. 5 schematically illustrates several contiguous reactive composite material sheets operatively connected by ignition bridges external to the bonding region for the propagation of an ignition reaction from sheet to sheet.

FIG. 5 illustrates a third exemplary arrangement of a plurality of contiguous RCM sheets 12 arranged and connected by solder assembly tabs 20 and ignitable bridges 22 to form an RCM sheet assembly 24 covering a large linear dimensioned bonding region 30 between two component bodies (not shown). The ignitable bridges 22 may be attached to the reactive sheets 12 with glue or small pieces of solder material if they are disposed inside a joint region, or with adhesive tape if they are disposed outside a joint region.

Those of ordinary skill in the art will recognize that the number of RCM sheets 12 comprising the various assemblies 24 shown in FIGS. 3, 4, and 5 may be varied depending upon the size and configuration of the large area bonding region 26 or large linear dimensioned bonding region 30. Preferably, RCM sheets 12 are arranged within the assemblies 24 such that the gaps G between adjacent sheets 12 are as far to the interior of the bonding region as possible, particularly gaps G which are parallel to the edges of the bonding region. Similarly, it will be recognized that the placement and number of tabs 20 and ignition bridges 22 may be varied depending upon the particular application and geometry of the assembly 24, provided that the assembly 24 is secured in a stable configuration during placement in the bonding region, and that reactions can propagate between the sheets 12 of the assembly 24 in a generally rapid and uniform manner.

Figure 6:
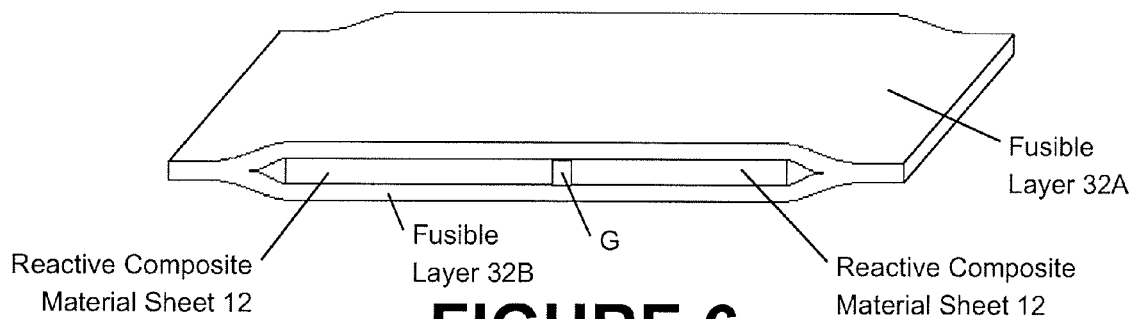
FIG. 6 is a cross sectional view of a pair of contiguous reactive composite material sheets sandwiched between two layers of a fusible material.

In lieu of assembly tabs 20, an assembly 24 of two or more RCM sheets 12 with ignition bridges 22 may be packaged as shown in FIG. 6 between layers 32A and 32B of a fusible material, such as a solder or a braze. Such packaging allows the fusible material layers 32A and 32B and the assembly 24 of RCM sheets 12 to be handled as a unit, aiding in placement within a bonding region. The RCM sheets 12 may be bonded to the fusible material layers 32A and 32B by rolling, pressing, or other suitable means to ensure that the packaging remains structurally secure.

Figure 7:
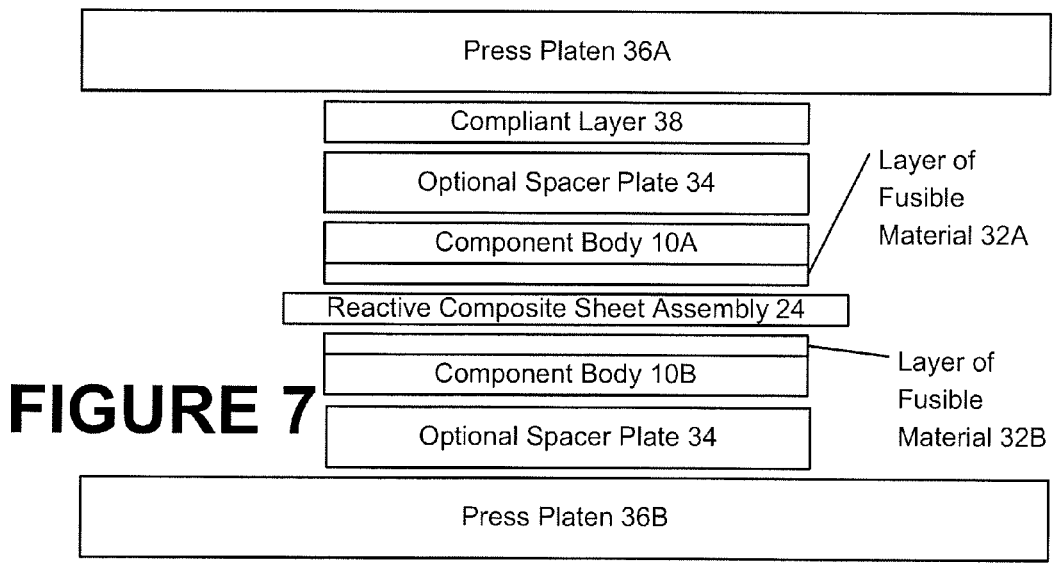
FIG. 7 is a block diagram representing an arrangement of components and layers for practicing a joining method of the present invention.

Once the assembly 24 is formed, with or without fusible layers 32A and 32B, it is disposed within the bonding region 26 between the components 10A and 10B to be joined. As shown in Block C of FIG. 2, the components 10A and 10B to be joined are pressed together to provide a generally uniform pressure over the bonding region 26. A variety of devices and techniques may be utilized to achieve the generally uniform pressure between components 10A and 10B over the bonding region 26, for example, hydraulic or mechanic presses. As is shown in FIG. 7, the components 10A and 10B may be disposed with suitable spacers 34 between a pair of press platens 36A and 36B. The selection of the spacers 34, and their effect on the resulting bond formed within the bonding region 26 are described below in further detail. An optional compliant layer 38, such as a rubber sheet, may be placed in the component arrangement between one component 10A or 10B and an adjacent press platen to accommodate any imperfections on the outside surfaces of the components 10A and 10B and the surfaces of the press platens 36A and 36B during the joining process. Pressure is exerted on the press platens 36A and 36B by any suitable means, such as by a hydraulic press with automatic pressure control.

Figure 8:
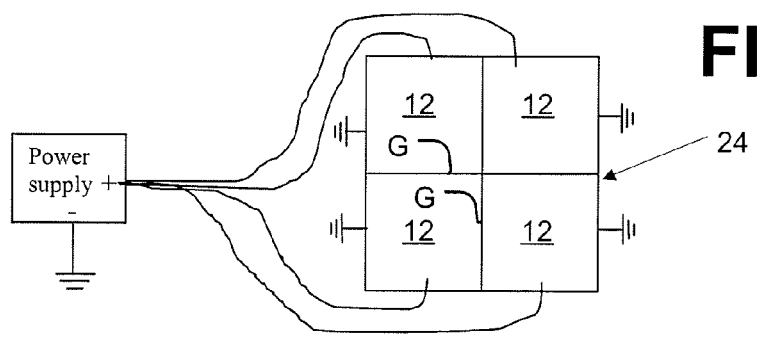
FIG. 8 illustrates an exemplary arrangement for simultaneously igniting a plurality of reactive composite material sheets during formation of a bonding joint in accordance with a method of the present invention.

The final step, shown in Block D of FIG. 2, is to ignite the RCM sheets 12 comprising the assembly 24. When bonding large areas, it is advantageous to symmetrically ignite the RCM sheets 12 at multiple points about the peripheral edge of the assembly 24, such as illustrated by the ignition point arrows in FIGS. 3 and 4. Interior sheets 12 which do not have edges outside the bonding region 26 are then ignited by the propagation of the reaction across the ignition bridges 22 within the assembly 24 as discussed previously. Simultaneous ignition of the sheets 12 in an assembly 24 can be conveniently effected by simultaneous application of an electrical impulse, such as shown in FIG. 8, or by laser impulse, induction, microwave radiation, or ultrasonic energy.

Those of ordinary skill in the art will recognize that a variety of devices which are capable of simultaneous delivery of ignition energy to the ignition points may be used. For example, an electrical circuit consisting of a capacitor and a switch associated with each ignition point may be employed. All the switches are controlled by a master switch, such that the capacitors charge and discharge simultaneously. An electrical pulse travels from the capacitors, through the switches to the ignition points on the RCM sheets 12, and to an electrical ground through the press platens 36A and 36B, igniting the sheets 12 within the assembly 24 and ultimately forming the bond between components 10A and 10B. Alternatively, a single large capacitor and switch may be connected to all the ignition points in parallel, such that energy is discharged to all ignition points about the assembly 24 simultaneously from the capacitor to ignite each sheet 12.

Figure 9:
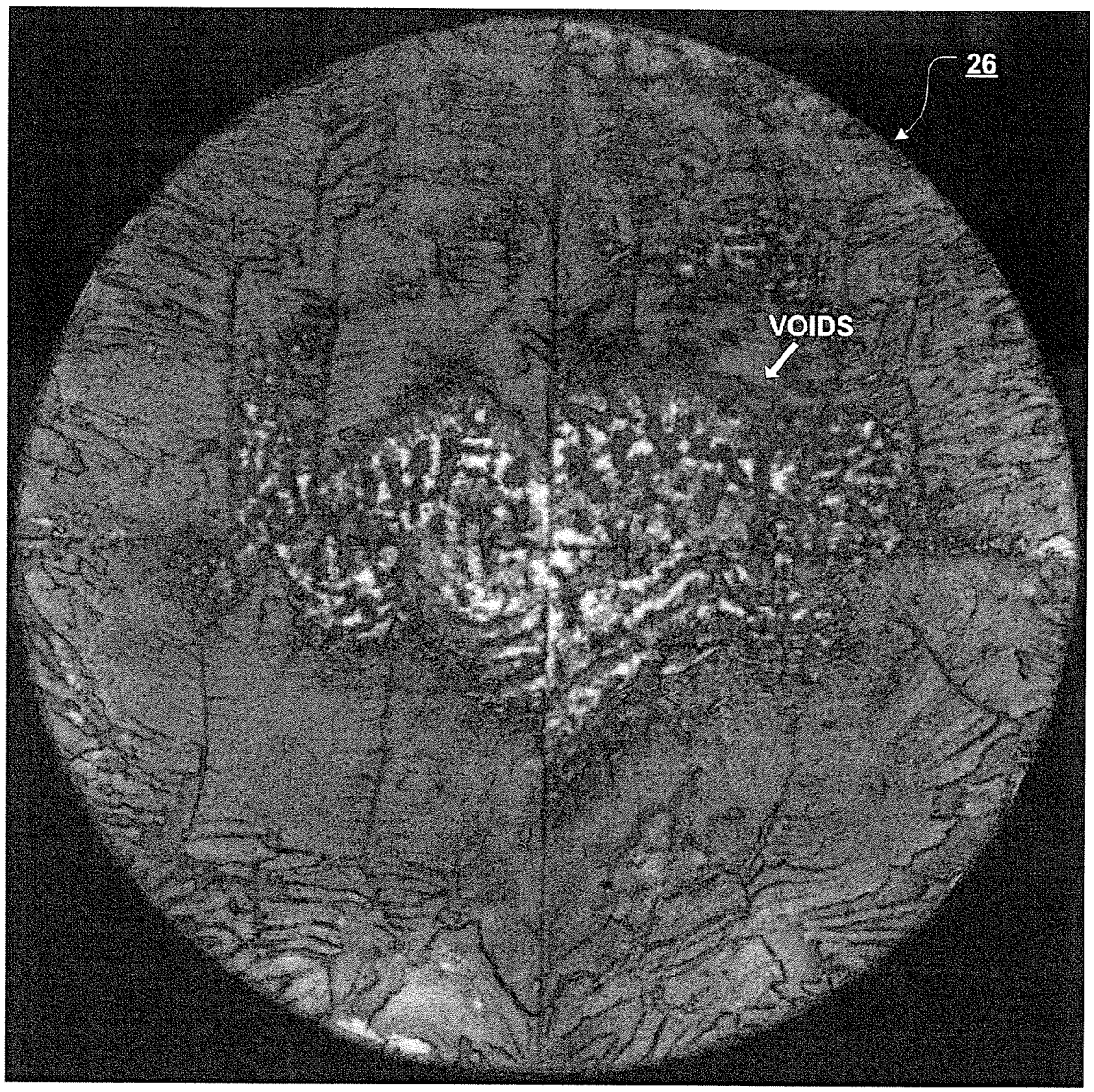
FIG. 9 is a top-plan acoustic image of a large dimension joint formed in accordance with a method of the present invention.

During the bonding process, it is known that non-uniform load distribution between the component bodies 10A and 10B will result in poor quality bonds with the presence of air gaps (voids) following the ignition of the sheets 12 within the assembly 24. Uneven load distribution typically results when the press platens 36A and 36B of the loading mechanism are significantly oversized or undersized compared to the size of the bonding region 26. This problem may be exacerbated when one or both of the components 10A and 10B to be joined are relatively thin. In the case where the press platens 36A and 36B are oversized relative to the size of the bonding region 26, the resulting pressure near the peripheral edges of the bonding region 26 is greater than the pressure near the center of the bonding region 26, and thus voids may form near the center of the bonding region 26. This is illustrated by the white regions visible near the center of the top-plan ultrasonic acoustic image or C-scan of a bonding region 26 shown in FIG. 9.

Figure 10:
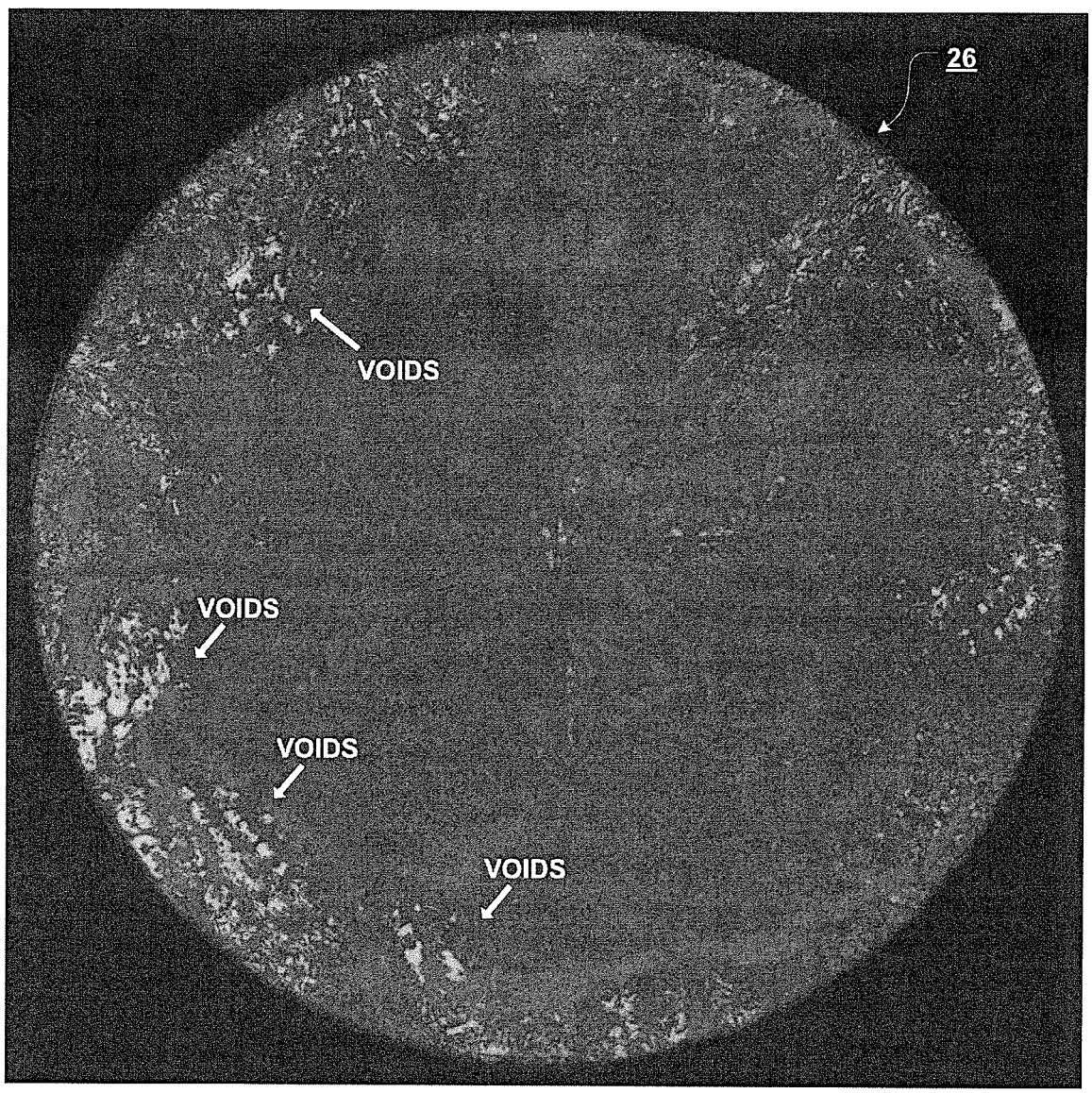
FIG. 10 is a top-plan acoustic image of a large dimension joint formed in accordance with an a method of the present invention, illustrating edge voids.

Conversely, in the case where the press platens 36A and 36B are undersized relative to the bonding region 26, the pressure near the center of the bonding region is greater than the pressure near the peripheral edges of the bonding region 26, and thus voids may appear about the peripheral edge as is shown by the white regions visible about the peripheral edges of the top-plan ultrasonic acoustic image or C-scan of a bonding region 26 shown in FIG. 10.

In order to distribute the load from the press platens 36A and 36B in a uniform manner to the bonding region 26, one or more spacer plates 34 sized to match the bonding region 26 are placed between the components 10A, 10B, and the platen or platens 36A, 36B. The ideal thickness for the spacer plate or plates 34 may be determined by a sequential process, in which a test bond is initially formed without the use of any spacer plate or plates 34. The resulting bond between components 10A and 10B is evaluated to identify the presence of voids. For applications where the press platens 36A and 36B are larger than the bonding region 26, the bond quality may be characterized by a ratio of voided area in the center quarter of the bonding region 26 to the total area of the bonding region. To reduce the voided area, spacer plates 34 of increasingly greater thickness are employed in additional bonding test procedures between components 10A and 10B until the desired ratio of voided areas to bonding region area is achieved for a bonding procedure. Preferably, the thickness of the spacer plates 34 is doubled between each bonding test procedure until the desired ratio is achieved.

Figure 11:
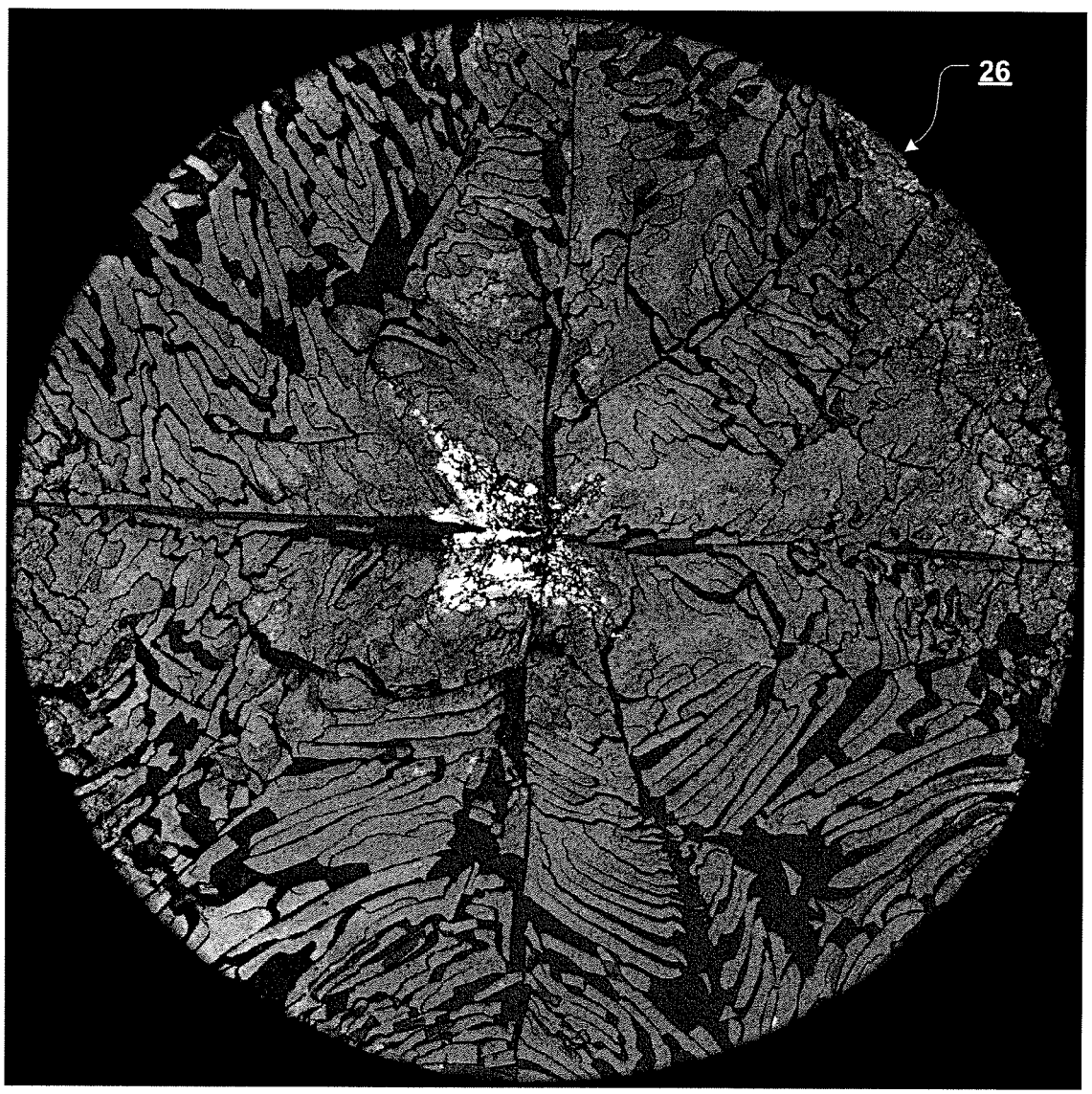
FIG. 11 is a top-plan acoustic image of a large dimension joint formed in accordance with an optimized loading bonding method of the present invention.

The procedure may be modified for large area joining applications where none or only a limited number of edge voids can be tolerated. For these applications the percentage of edge voids, defined as the ratio of voided area in the outer quarter of the bonding region 26 to the total joining area, may be tracked as described above. If the process of doubling the spacer plate thickness results in an acceptable percentage of center voids and no edge voids, then the optimal spacer plate thickness has been derived. If on the other hand, the process results in an acceptable percentage of center voids, but some percentage of edge voids are detected, then the spacer plate thickness should be reduced to the average thickness of the present and previous spacer plate thicknesses. This process is repeated until a spacer plate 34 having a determined thickness results in the minimum amount of center voids and the desired amount of edge voids. This is illustrated by the small white region near the center and the general lack of any white regions visible near the peripheral edges of the top-plan ultrasonic acoustic image or C-scan of a bonding region 26 shown in FIG. 11.

For applications where the press platens 36A and 36B are undersized relative to the bonding region 26, the bond quality may be characterized by a ratio of voided area in the outer quarter of the bonding region 26 to the total area of the bonding region. To reduce the voided area, spacer plates 34 of increasingly greater thickness are employed in additional bonding test procedures between components 10A and 10B until the desired ratio of voided areas to bonding region area is achieved for the bonding procedure. Preferably, the thickness of the spacer plates 34 is doubled between each bonding test procedure until the desired ratio is achieved.

The methods of the present invention for joining component bodies 10A and 10B over a large dimension bonding region 26 are further illustrated by the following six examples.

EXAMPLE 1

In this example, reactive or ignition bridges 22 and assembly tabs 20 were disposed on an assembly 24 inside the peripheral edges of a bonding region 26 as is illustrated in FIG. 3. As shown in the general arrangement of FIG. 7, the various components were assembled between press platens 36A and 36B, with the bonding region 26 to be formed between a nickel disk component 10A (0.2 in. thick) and a brass disk component 10B (0.6 in. thick). The bonding region 26 was circular, with an outer diameter of 17.7 in. and an area of 246 sq. inches. Layers of fusible material 32A and 32B, such as tin--lead solder, were pre-applied to the nickel and brass bodies 10A and 10B. To provide coverage for the bonding region 26, a total of sixteen RCM sheets 12 (Ni—Al, 80 µm thick, reaction velocity 7 m/s) were pre-assembled as an assembly 24 as shown in FIG. 3, by pressing a total of twelve indium solder tabs 20 across the gaps G. To ensure reaction propagation across the gaps G, six reactive foil ignition bridges 22 were attached across gaps G within the bonding region 26. Small pieces of indium solder were additionally used to affix the reactive foil ignition bridges 22 to the RCM sheets 12.

The brass disk 10B was placed on a flat surface with the pre-applied layer of tin-lead solder 32B facing upwards. The portions of the assembly 24 were positioned adjacent to each other with a minimum separation gap G on top of the brass disk 10B so that they completely covered the bond region 26. The nickel disk 10A was placed above the reactive multilayer foil with the pre-applied layer of tin-lead solder 32A facing down, in contact with the RCM sheets 12 (Ni—Al, 80 µm thick, reaction velocity 7 m/s) in the assembly 24. An aluminum spacer plate 34 0.75 inches thick, with a diameter of 17.7 inches, was positioned above and aligned with the nickel disk 10A. The spacer thickness was previously determined using the process described above, by making several joints with different sized spacer plates. A thin layer of hard rubber 38, with a matching surface area, was placed above the aluminum spacer plate 34 to accommodate any imperfections on the outside surfaces of the brass and nickel disks 10A and 10B, and the surfaces of the platens of the press 36A, 36B used to apply a load during joining. The entire arrangement was transferred to a hydraulic press, where a load of 107,000 lbs was applied to the arrangement. The sheets 12 of the assembly 24 were then ignited electrically, simultaneously at twelve ignition points around the circumference identified by the arrows in FIG. 3, resulting in the bonding of the component bodies 10A and 10B to each other.

EXAMPLE 2

In this example, assembly tabs 20 were disposed on an assembly 24 inside the peripheral edges of a bonding region 26, while the reactive or ignition bridges 22 were disposed outside the peripheral edges of the bonding region 26, as is illustrated in FIG. 4. As shown in the general arrangement of FIG. 7, the various components were assembled between press platens 36A and 36B, with the bonding region 26 to be formed between a nickel disk component 10A (0.2 in. thick) and a brass disk component 10B (0.6 in. thick). The bonding region 26 was circular, with an outer diameter of 17.7 in. and an area of 246 sq. inches. As with Example 1, above, layers of fusible material 32A and 32B, such as tin-lead solder, were pre-applied to the nickel and brass bodies 10A and 10B. To provide coverage for the bonding region 26, a total of eight RCM sheets 12 were pre-assembled as an assembly 24 as shown in FIG. 4, by pressing a total of three indium solder tabs 20 across the gaps G. To ensure reaction propagation across the gaps G, eight reactive foil ignition bridges 22 were attached across gaps G outside the bonding region 26. Small pieces of high temperature tape (Kapton®) were used to provide adhesion between the ignition bridges 22 and the RCM sheets 12, and to further serve the purpose of providing structural support to the assembly 24.

Next, the brass disk 10B was placed on a flat surface with the pre-applied layer of tin-lead solder 32B facing upwards. The portions of the assembly 24 were positioned adjacent to each other with a minimum separation gap on top of the brass disk 10B so that they completely covered the bond region 26. The nickel disk 10A was placed above the reactive multilayer foil with the pre-applied layer of tin-lead solder 32A facing down, in contact with the RCM sheets 12 in the assembly 24. An aluminum spacer plate 34 0.75 inches thick, with a diameter of 17.7 inches, was positioned above and aligned with the nickel disk 10A. The spacer thickness was previously determined using the process described above, by making several joints with different sized spacer plates. A thin layer of hard rubber 38, with matching surface area, was placed above the aluminum spacer plate 34 to accommodate any imperfections on the outside surfaces of the brass and nickel disks 10A and 10B, and the surfaces of the platens of the press 36A, 36B used to apply a load during joining. The entire arrangement was transferred to a hydraulic press, where a load of 107,000 lbs was applied to the arrangement. The sheets 12 of the assembly 24 were then ignited electrically, simultaneously at sixteen ignition points around the circumference identified by the arrows in FIG. 4, resulting in the bonding of the component bodies 10A and 10B to each other.

EXAMPLE 3

In this example, assembly tabs 20 and ignition bridges 22 were disposed on an assembly 24, both inside and outside of the peripheral edges of a bonding region 26, as is illustrated in FIG. 12. Component bodies 10A and 10B consisting of a 0.3" thick copper alloy disk (10A) and a 0.5" thick copper alloy disk (10B) were arranged with the assembly 24 in the bonding region 26, according to the general arrangement shown in FIG. 7. The bonding region 26 was circular, with a diameter of 13 inches and an area of 133 sq. inches. Tin-lead solder was used as the fusible material layers 32A and 32B. Nine RCM sheets 12 were pre-assembled in the assembly arrangement 24 shown in FIG. 12 by pressing four indium solder tabs 20 across sheet gaps G. To ensure reaction propagation across the sheet gaps G, ten reactive ignition bridges 22 were attached at critical boundaries, two within the bonding region 26 and eight outside the bonding region 26. The various components were arranged as shown in FIG. 7 with the 0.5" copper disk 10B at the bottom, but with no optional spacer plate 34 below it, then the assembly 24 was positioned within the bonding region 26, and then the 0.3" copper disk 10A placed on top. An aluminum spacer plate 34 was positioned above, and aligned with, the 0.3" thick copper disk 10A. A thin layer of stiff foam, with a matching surface area dimension served as the compliant layer 78. The entire arrangement was transferred to a hydraulic press and a load of 57,850 lbs was applied to the assembly 24 by the press. The RCM sheets 12 were ignited electrically, simultaneously at twelve points evenly spaced around the circumference, as indicated by the arrows in FIG. 12, to initiate the bond forming reaction.

The resulting joined assembly was ultrasonically (acoustically) scanned to determine the quality of the bond. A representative acoustic scan is shown in FIG. 13, with areas of poor bond quality including trapped air, know as voids, displayed as bright white regions adjacent the peripheral edge of the bonding region 26. The void content, measured as a percentage of the total bond area, is less than 1%, indicating a high quality bond. Dark lines in FIG. 13 indicate cracks or gaps between individual sheets of reactive composite material that have been filled in by molten solder during the joining process. The non-straight dark lines are due to cracking of individual sheets of the reactive composite material which occurs during joining due to volume contraction of the sheets as they react. The filled gaps between individual pieces of reactive multilayer foil are straight lines and reveal the pattern of individual sheets of the reactive composite material that were pre-assembled into the assembly 24 prior to joining.

EXAMPLE 4

Figure 14:
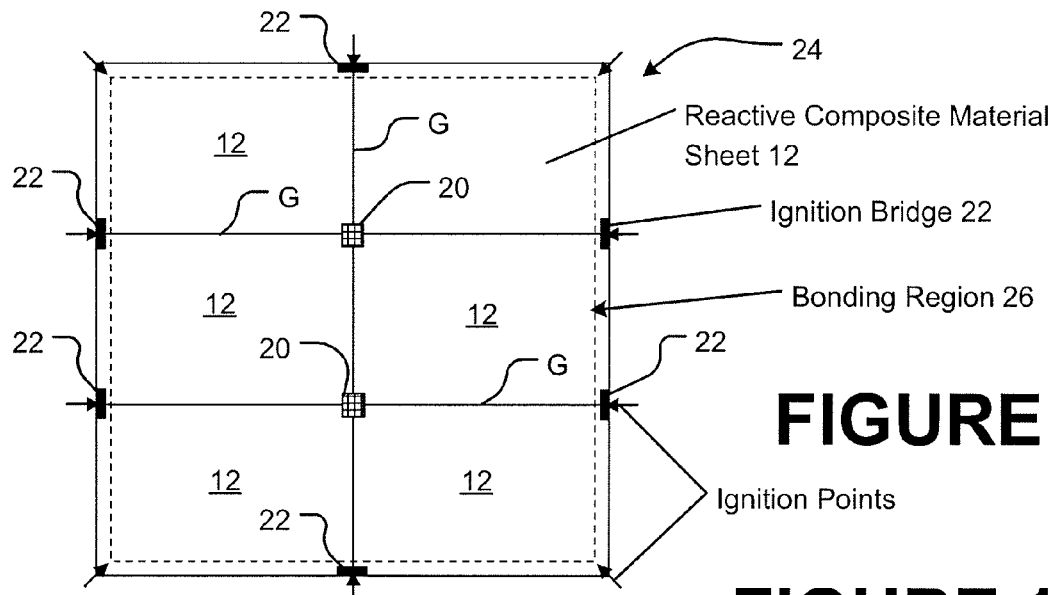
FIG. 14 illustrates an exemplary arrangement of contiguous reactive composite material sheets, fusible material support tabs, ignition bridges, and ignition points.

In this example, an assembly 24 of RCM sheets 12 is arranged with assembly tabs 20 disposed within a square bonding region 26, and with ignition bridges 22 outside of the peripheral edges of the square bonding region 26, as is illustrated in FIG. 14. The components 10A and 10B to be bonded consist of a square plate 10A of aluminum 0.5" thick and a square plate 10B of titanium-aluminum-vanadium alloy 0.5" thick. The bonding region 26 defines a square with sides 12 inches long and an area of 144 sq. inches. A tin-silver solder was used to provide fusible layers 32A and 32B on the two component bodies 10A, 10B. Six equal sized RCM sheets 12 were pre-assembled in the pattern shown in FIG. 14 by pressing two indium solder tabs 20 across gaps G between the sheets 12. To ensure reaction propagation across the gaps G, six reactive multilayer foil ignition bridges 22 were attached at critical boundaries outside the bonding region 26. As shown in the general arrangement of FIG. 7, a square spacer plate 34 of aluminum, 0.5 inches thick with 12 inch sides was placed on a flat surface. The titanium alloy component body 10B, reactive multilayer foil assembly 24, and aluminum component body 10A were then placed on top of the spacer plate 34. A second square aluminum spacer plate 34 of the same dimension as the first spacer plate, was positioned above, and aligned with, the aluminum component body 10A. A thin layer of hard rubber disposed above the second spacer plate 34 served as a compliant layer 38. The entire assembled arrangement was transferred to a hydraulic press and a load of 62,640 lbs was applied to the assembled arrangement by the press platens 36A and 36B. The RCM sheets 12 were ignited electrically, simultaneously at ten points evenly spaced around the circumference, indicated by arrows in FIG. 14, resulting in a bonding reaction between the component bodies 10A and 10B.

Figure 15:
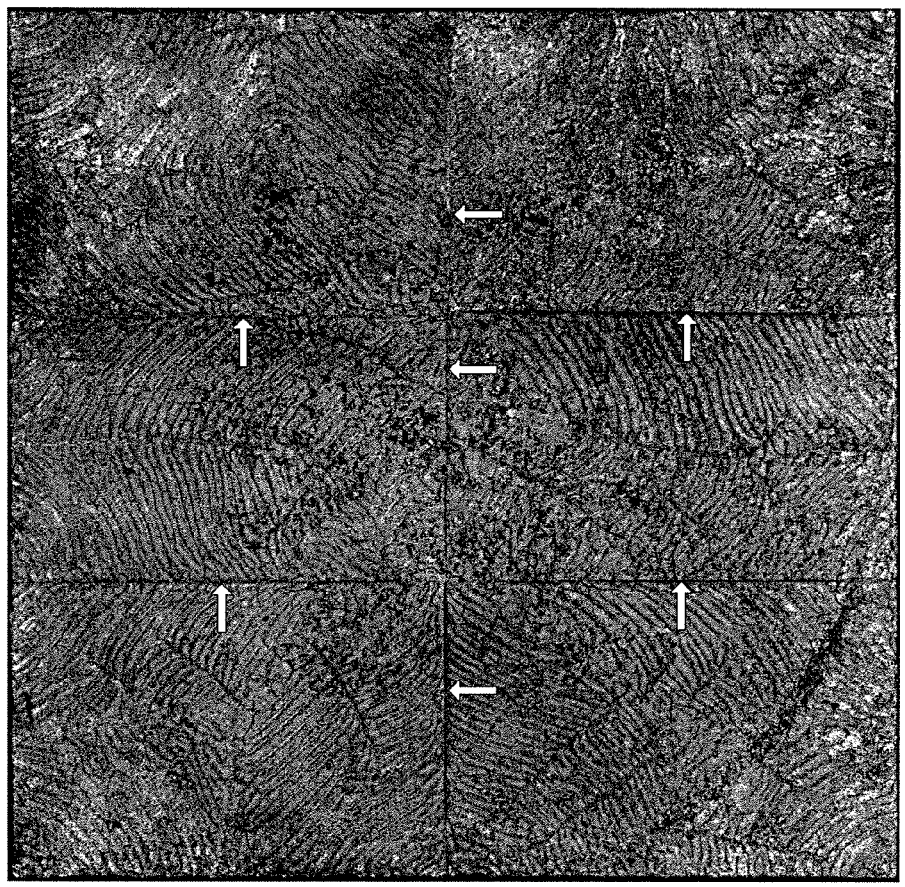
FIG. 15 is a top-plan acoustic image of a large dimension joint resulting from the arrangement illustrated in FIG. 14.

The resulting joint between the component bodies 10A and 10B was ultrasonically scanned to determine the quality of the bond. An acoustic scan is shown in FIG. 15. The void content, measured as a percentage of the total bond area, is less than 1%, indicating a high quality bond. The dark horizontal and vertical lines in FIG. 15 indicate gaps between individual RCM sheets 12 that have been filled by molten solder during the joining process. Thus from the ultrasonic C-scan it can clearly be observed that six sheets of reactive composite material effectively joined the two component bodies 10A and 10B.

EXAMPLE 5

Figure 16:
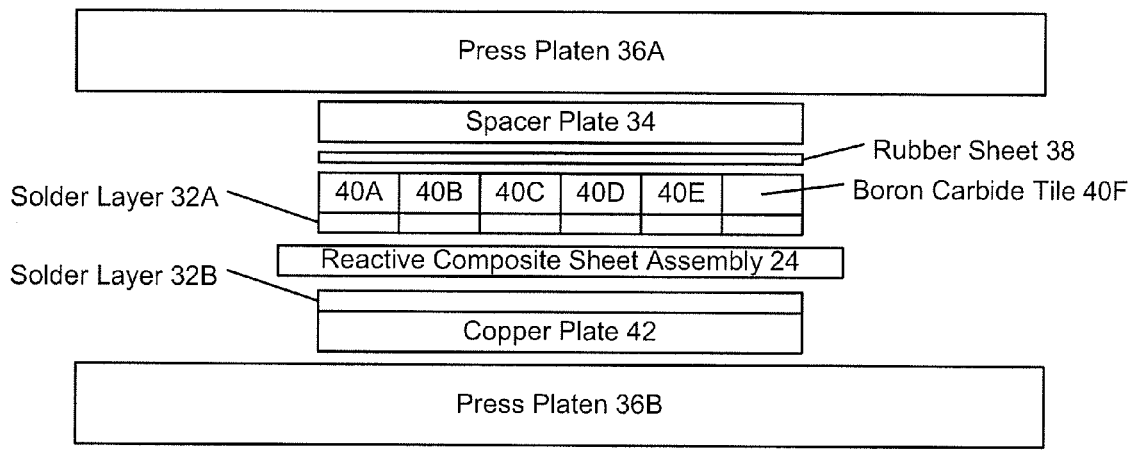
FIG. 16 is a block diagram representing a first exemplary arrangement of components and layers for practicing a joining method of the present invention.

In this example, an assembly 24 of RCM sheets 12 was utilized to simultaneously join a set of discrete component tiles 40A-40F to a single base component body 42, as shown schematically in FIG. 16. Each of the discrete component tiles 40A-40F is composed of boron carbide ($B_4C$), and has dimensions of 6.25 inches long by 6 inches wide, by 0.25 inches thick. The single base component body 42 comprises a copper plate having overall dimensions of 26.25 inches long by 7.25 inches wide by 0.31 inches thick. The bonding region 26 has a rectangular configuration, with a length of 25 inches, a width of 6 inches, and an area of 150 sq. inches. Layers of tin-silver solder pre-applied to the copper plate 42 and to each boron carbide tile 40A-40F act as fusible material layers 32A and 32B. Six RCM sheets 12 were pre-assembled into an assembly 24 by taping ten reactive multilayer foil ignition bridges 22 across gaps between the sheets 12 outside of the bonding region 26, as shown in FIG. 5, increasing the probability of simultaneous ignition of all the sheets 12. The copper plate 42 was placed on a flat surface with the layer of tin-silver solder 32B facing upwards. The assembly 24 was positioned on top of the copper plate 42 so that it completely covered the bonding region 26. Each boron carbide tile 40A-40F was placed above the assembly 24 in the desired configuration, with the layers of tin-silver solder 32A facing down, in contact with the sheets 12 of the assembly 24. In the present example, the boron carbide tiles 40A-40F were positioned end to end, in contact with each other and aligned with the rectangular bonding region 26, as shown in FIG. 16. A compliant layer 38 consisting of a thin layer of hard rubber, matching the configuration of the bonding region 26, was placed above the boron carbide tiles 40A-40F. An aluminum spacer plate 34 was positioned above the compliant layer 38, and aligned with the bonding region 26. The entire arrangement was transferred to a hydraulic press, and a load of 65,250 lbs was applied to the arrangement by the press platens 36A and 36B. The RCM sheets 12 were ignited electrically, simultaneously at twelve evenly spaced points corresponding to each of the ignition bridges 22 and one at each end of the assembly 24, resulting in a bonding reaction between the copper plate 42 and the boron carbide tiles 40A-40F.

EXAMPLE 6

Figure 17:
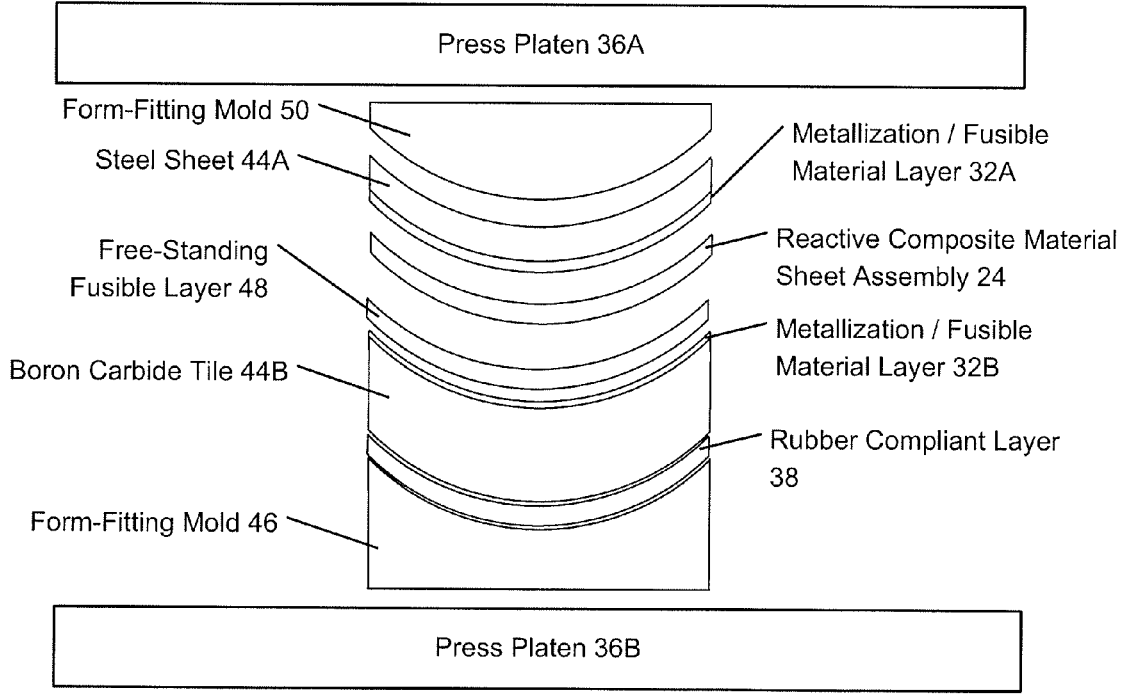
FIG. 17 is a block diagram representing a second exemplary arrangement of components and layers for practicing a joining method of the present invention.

In this example, an assembly 24 of RCM sheets 12 was utilized to bond two curved component bodies 44A and 44B over matching non-planar (curved) surfaces, as illustrated in FIG. 17. Specifically, a component body 44A comprising a curved sheet of steel having a thickness of 0.015 inches was bonded to a component body 44B comprising a curved boron carbide tile. The bonding region was not restricted to a regular shape, and had a surface area of approximately 111 sq. inches. Fusible layers 32A and 32B of tin-silver solder were pre-applied to the sheet steel and to the boron carbide tile. Six RCM sheets 12 were pre-assembled into an assembly 24 by taping six reactive multilayer foil ignition bridges 22 across gaps G outside of the irregular curved bonding region 26 and pressing two indium solder tabs across gaps G inside of the bonding region 26. The boron carbide tile was placed on a form-fitting mold 46 with the fusible layer 32B of tin-silver solder facing upwards. The form-fitting mold 46 was lined with a compliant layer 38 of rubber to accommodate surface imperfections. A free-standing fusible layer 48, consisting of a silver-tin-titanium solder (S-Bond® 220) comprising four pieces each 3 inches wide, was positioned over the boron carbide tile 44B. The RCM assembly 24 was then positioned on top of the free-standing fusible layer 48 so that it completely covered the irregular curved bonding region 26. The steel sheet 44A was next placed above the assembly 24 with the fusible layer 32A of tin-silver solder facing down, in contact with the RCM sheets 12. A matching form fitting mold 50 was positioned above the steel sheet 44A, and the entire assembly was transferred to a hydraulic press. A load of 32,000 lbs was applied to the assembly by the press platens 36A and 36B, and the reactive composite material was ignited electrically, simultaneously at ten points evenly spaced around the peripheral edges of the bonding region 26 to initiate the bonding reaction throughout the curved irregular bonding region.

As various changes could be made in the above constructions and procedures without departing from the scope of the invention, it is intended that all matter contained in the above description or shown in the accompanying drawings shall be interpreted as illustrative and not in a limiting sense.

The invention claimed is:

1. A method of forming a bonded plate assembly, comprising the steps of:
providing a brass plate having a top surface, and pre-wetting the top surface with a solder layer;
providing a nickel plate having a bottom surface, and pre-wetting the bottom surface with a solder layer;
introducing a plurality of discrete pieces of bonding foil in a laterally adjacent and spaced apart arrangement in a common plane parallel to, and between, the top surface of the brass plate and the bottom surface of the nickel plate, wherein each discrete piece of the bonding foil is an ignitable heterogeneous stratified structure for the propagation of an exothermic reaction;
interconnecting each spaced apart and laterally adjacent discrete piece of bonding foil with at least one bridge structure capable of transferring an exothermic reaction across an interspatial gap separating one laterally adjacent piece from another; and,
pressing the brass plate and the nickel plate together and initiating an exothermic reaction in at least one of said discrete pieces of the bonding foil introduced there between to melt and bond the solder layer on the brass plate with the solder layer on the nickel plate without affecting the microstructure or flatness of the nickel plate in the formation of the bonded plate assembly.

2. The method of forming the bonded plate assembly of claim 1, further comprising,
aligning the nickel plate and the brass plate in a press, prior to pressing and thereafter applying a load in excess of at least 50,000 lbs.

3. The method of forming the bonded plate assembly of claim 1, wherein the solder layers are tin-lead solder.

4. The method of forming the bonded plate assembly of claim 1, wherein the solder layers are of substantially the same thickness.

5. The method of forming the bonded plate assembly of claim 1, further comprising electrically igniting at least one discrete piece of the bonding foil to initiate the exothermic reaction.

6. The method of forming the bonded plate assembly of claim 1, wherein the thickness of each discrete piece of the bonding foil falls within the range from about 0.002 to about 0.003 inches.

7. The method of forming the bonded plate assembly of claim 1, wherein the solder layers have a thickness that falls within the range from about 0.005 to 0.010 inches.

8. The method of forming the bonded plate assembly of claim 1, wherein the pressure is applied via a hydraulic press, screw or manual press.

9. The method of forming the bonded plate assembly of claim 1, wherein each discrete piece of the bonding foil is selected so that the alternating layers within the foil produce silicides, aluminides, borides, carbides, thermite reacting compounds, alloys, metallic glasses and composites upon reaction.

10. The method of forming the bonded plate assembly of claim 1, wherein the solder material is selected from among indium-tin, tin-lead, or tin-silver-copper.

11. The method of forming the bonded assembly of claim 1, wherein the nickel plate is a substantially circular, disc-shaped plate.

12. A large area bonded plate assembly comprising:
a brass plate, a nickel plate, and a plurality of laterally adjacent discrete pieces of bonding foil disposed in a spaced-apart arrangement in a common plane parallel to and between said brass plate and said nickel plate, each laterally adjacent discrete piece of bonding foil interconnected to at least one additional discrete piece of bonding foil by a bridging structure capable of transferring an exothermic reaction across a gap between said laterally adjacent discrete pieces of said bonding foil, wherein each discrete piece of the bonding foil is an ignitable heterogeneous stratified structure for the propagation of an exothermic reaction in order to bond the brass plate to the nickel plate at adjacent surfaces without affecting the microstructure or the flatness of the plates in the formation of the bonded plate assembly.

13. The bonded plate assembly of claim 12, further comprising a first solder bond layer disposed between the brass plate and the plurality of pieces of the bonding foil and a second bond layer between the nickel plate and the plurality of pieces of the bonding foil.

14. The bonded plate assembly of claim 12, wherein the thickness of each piece of the bonding foil falls within the range from about 0.002 to about 0.003 inches.

15. The bonded plate assembly of claim 12, further comprising solder layers having a thickness within the range from about 0.005 to 0.010 inches.

16. The bonded plate assembly of claim 12, wherein each piece of the bonding foil is selected so that the alternating layers within the foil produce silicides, aluminides, borides, carbides, thermite reacting compounds, alloys, metallic glasses and composites upon reaction.

17. The bonded plate assembly of claim 12, wherein the nickel plate is a substantially circular, disc-shaped plate.

* * * * *